United States Patent
Wynn (10) Patent No.: US 6,233,438 B1
(45) Date of Patent: May 15, 2001

(54) WIDE-RANGE POWER CONTROL SYSTEMS AND METHODS FOR RADIO FREQUENCY TRANSMITTERS AND MOBILE RADIOTELEPHONES

(75) Inventor: Stephen Robert Wynn, Lynchburg, VA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/048,431

(22) Filed: Mar. 26, 1998

(51) Int. Cl.[7] ........................................ H04B 1/04
(52) U.S. Cl. .................... 455/126; 455/127; 455/116
(58) Field of Search ........................ 455/116, 127, 455/126, 115, 117, 237.1, 235.1, 250.1, 553, 69; 330/127, 207

(56) References Cited

U.S. PATENT DOCUMENTS

| | | | |
|---|---|---|---|
| 4,553,105 | * 11/1985 | Sasaki | 330/145 |
| 5,214,393 | * 5/1993 | Aihara | 330/279 |
| 5,276,912 | * 1/1994 | Siwiak et al. | 455/73 |
| 5,313,658 | * 5/1994 | Nakamura | 455/69 |
| 5,507,023 | * 4/1996 | Suganuma et al. | 455/234.1 |
| 5,530,923 | * 6/1996 | Heinonen et al. | 455/126 |
| 5,551,057 | 8/1996 | Mitra | 455/33.1 |
| 5,568,654 | * 10/1996 | Fukawa | 455/456 |
| 5,606,284 | * 2/1997 | Tamesue et al. | 330/129 |
| 5,606,285 | 2/1997 | Wang et al. | 330/134 |
| 5,621,723 | 4/1997 | Walton, Jr. et al. | 370/18 |
| 5,623,486 | * 4/1997 | Dohi et al. | 370/342 |
| 5,627,857 | * 5/1997 | Wilson | 375/219 |
| 5,669,066 | * 9/1997 | Borg et al. | 455/69 |
| 5,708,681 | * 1/1998 | Malmemes et al. | 375/297 |
| 5,722,061 | * 2/1998 | Hutchison, IV et al. | 455/245.1 |
| 5,758,269 | * 5/1998 | Wu | 455/127 |
| 5,832,373 | * 11/1998 | Nakanishu et al. | 455/126 |
| 5,892,396 | * 4/1999 | Anderson et al. | 330/129 |
| 5,909,643 | * 6/1999 | Aihara | 455/127 |
| 5,913,154 | * 6/1999 | Wynn | 455/127 |

* cited by examiner

*Primary Examiner*—Nay Maung
*Assistant Examiner*—Joy Contee
(74) *Attorney, Agent, or Firm*—Myers Bigel Sibley & Sajovec (57) ABSTRACT

Radio frequency transmitters and transmitting methods control amplification of a radio frequency power amplifier, attenuation of a voltage standing wave ratio (VSWR) attenuator, and attenuation of a power control attenuator, in response to power control signals. Wide ranges of power control, for example up to 60 dB or more, may thereby be provided without unduly increasing transmitter complexity or power consumption.

28 Claims, 7 Drawing Sheets

WIDE-RANGE POWER CONTROL SYSTEMS AND METHODS FOR RADIO FREQUENCY TRANSMITTERS AND MOBILE RADIOTELEPHONES

FIELD OF THE INVENTION

This invention relates to radio frequency (RF) transmitters such as are used in mobile radiotelephones, and more particularly to power control systems and methods for RF transmitters.

BACKGROUND OF THE INVENTION

RF transmitters are widely used in radio frequency communications systems, including but not limited to mobile radiotelephones. As is well known to those having skill in the art, an RF transmitter generally includes a modulator that modulates an input signal and a radio frequency power amplifier that is coupled to the modulator to amplify the modulated input signal. The radio frequency power amplifier is coupled to an antenna that transmits the amplified modulated input signal. The RF transmitter may be part of an RF transmitter/receiver (transceiver), wherein a duplexer or RF switch is placed between the RF power amplifier and the antenna, so that received communication signals from the antenna may be switched to a receive circuit.

RF transmitters are widely used in repeater-based communications systems, such as cellular and satellite mobile radiotelephone communications systems. Often, such systems allow a base station to send a command to the mobile radiotelephone to adjust its transmitter power. This allows a mobile radiotelephone to transmit at relatively high power when it is relatively far from a base station, and to transmit at relatively low power when the radiotelephone is relatively close to the base station. Accordingly, power control systems and methods can reduce battery drain in the mobile radiotelephone, to thereby allow longer standby time or transmission time. The mobile radiotelephone components may also have a longer operational life, due to reduced power use.

Reduced power transmission can also reduce interference between nearby channels of the same radiotelephone communications system or another system. The reduction of interference may be particularly important for cellular or satellite radiotelephone communications systems that use code division multiple access (CDMA) designs. More specifically, CDMA systems are susceptible to the "near-far" problem. The near-far problem occurs when one mobile radiotelephone is being received at a much higher power level than another mobile radiotelephone. For example, assume a second mobile radiotelephone is much closer to a base station than a first mobile radiotelephone. Thus, the second mobile radiotelephone will have a higher received power at the base station. Because there is little interference relative to the second mobile radiotelephone's received signal, it can be decoded properly. However, the signal from the first mobile radiotelephone may have a high bit error rate. Although the two signals may not be strongly correlated, the magnitude of the interference from the second mobile radiotelephone may be so strong that it degrades the first mobile radiotelephone signal.

The near-far problem is often reduced using power control systems and methods in mobile radiotelephones. Power control should preferably allow the transmitted signals from all mobile radiotelephones to be received at the same level and for the signals to be constant over time. Recent U.S. Patents that describe power control systems and methods include U.S. Pat. No. 5,551,057 to Mitra entitled "Cellular Mobile Radio System Power Control"; U.S. Pat. No. 5,606,285 to Wang et al. entitled "Power Control Circuit for Use With Transmitter"; U.S. Pat. No. 5,621,723 to Walton, Jr. et al. entitled "Power Control in a CDMA Network"; and U.S. Pat. No. 5,623,486 to Dohi et al. entitled "Transmission Power Control Method and Apparatus for Mobile Communications Using a CDMA (Code Division Multiple Access) System".

Figure 1:
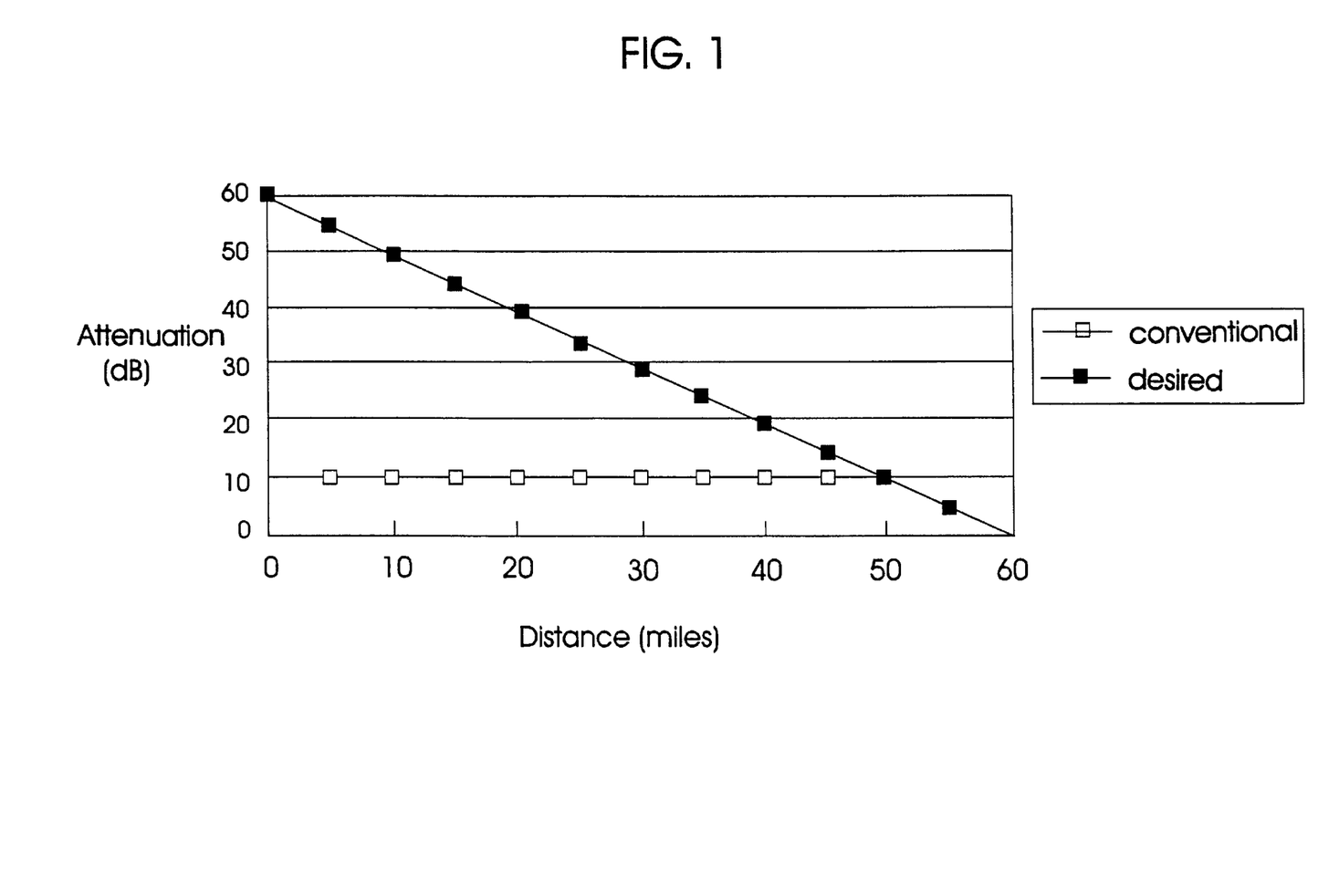
FIG. 1 graphically illustrates conventional power control and desired power control as a function of distance.

Power control systems and methods for transmitters of mobile radiotelephones generally operate over a limited power control range, such as 10 dB. This range has been obtained conventionally by providing a power control signal to the radio frequency power amplifier, to reduce the amplification thereof by up to 10 dB, in 1 dB steps. However, it would be desirable to obtain a wider range of power control. For example, in a mobile radiotelephone communications system, transmissions from a far radiotelephone (for example, 60 miles from a base station) may be received at the base station at a sensitivity level of –116 dBm. If a near radiotelephone (for example immediately adjacent the base station) is transmitting at a power of 30 dBm or 1 watt, then the effective power reaching the receiver may be about 0 dBm or 1 milliwatt, taking into account antenna coupling losses. If the base station has an Adjacent Channel Interference Power Ratio (ACIPR) of about 50 dB, then the preferred attenuation at the near radiotelephone is about 116 dB–50 dB, or about 66 dB. Accordingly, in order to reduce adjacent channel interference and the near-far problem, it would be desirable for a power control system to have a 60 dB range for a typical 1 watt mobile radiotelephone, compared to a conventional 10 dB range. With such a range, the desired distribution of power for mobile radiotelephones across the radius of the coverage area could be controlled as shown in FIG. 1.

Unfortunately, it may be difficult to obtain a wide range of power control in conventional RF transmitters. For example, in order to obtain a desired range of power control in a linear radio frequency power amplifier, the power amplifier may need to be operated in class-A. This may cause the amplifier to consume excessive DC power and may reduce the battery life considerably.

Other solutions to the near-far problem may reduce adjacent interference by providing narrower intermediate frequency (IF) filtering, to remove as much of the interfering signal as possible. This technique may be effective for some adjacent signals. However, as the adjacent signal falls within the desired bandwidth, filtering may be ineffective, because it also filters a desired signal along with the interference.

Another technique to reduce the near-far problem is to use multiple receivers and/or antennas and perform relatively complicated processing on the data to determine antenna/receiver correlation. The correlation information may then be used to subtract the interfering signal from the desired signal. Unfortunately, this technique may increase the cost and/or complexity of the mobile radiotelephone and/or base station.

SUMMARY OF THE INVENTION

It is therefore an object of the present invention to provide improved systems and methods for power control for radio frequency transmitters.

It is another object of the present invention to provide power control systems and methods for radio frequency transmitters that are capable of a wider range of power control than conventional systems.

It is another object of the present invention to provide power control systems and methods that can be sufficiently wide range to reduce near-far interference in mobile radiotelephone communications systems.

These and other objects are provided, according to the present invention, by radio frequency transmitters and transmitting methods that control amplification of a radio frequency power amplifier, attenuation of a voltage standing wave ratio (VSWR) attenuator, and attenuation of a power control attenuator, in response to power control signals. Wide ranges of power control, for example up to 60 dB or more, may thereby be provided without unduly increasing transmitter complexity or power consumption.

More specifically, radio frequency transmitters according to the present invention include a modulator that modulates an input signal and a radio frequency power amplifier that is coupled to the modulator. The radio frequency power amplifier amplifies the modulated input signal by a predetermined amount in response to a first power control signal. A power control attenuator is coupled between the output of the radio frequency power amplifier and an antenna, to attenuate the output of the radio frequency power amplifier in response to a second power control signal. Finally, a voltage standing wave ratio (VSWR) attenuator is also coupled between the radio frequency power amplifier output and the antenna, to attenuate the output of the radio frequency power amplifier in response to reflected power from the antenna. The VSWR attenuator is responsive to a third power control signal. A power controller generates the first power control signal, the second power control signal and the third power control signal, to thereby provide wide range power control for the radio frequency transmitter. By controlling the power amplifier, power control attenuator and VSWR attenuator, a wide range of power control may be obtained.

The power controller preferably controls the amplifier, power control attenuator and VSWR attenuator in a predetermined sequence, in order to provide wide range power control without unduly dissipating power in the RF transmitter. More specifically, in one embodiment, the power controller provides minimum amplification of the radio frequency power amplifier via the first signal, before attenuating the power control attenuator via the second signal. In a specific embodiment, the power controller can bypass the radio frequency power amplifier before attenuating the power control attenuator via the second signal.

In another embodiment, the power controller provides minimum amplification of the radio frequency power amplifier via the first signal, before attenuating the output of the radio frequency power amplifier via the second signal and the third signal. In yet another embodiment, the power controller provides maximum attenuation of the output of the radio frequency power amplifier via the third signal before attenuating the output of the radio frequency power amplifier via the first and second signals.

Accordingly, a wide range power control signal may be applied to the power controller. The power controller then generates the first, second and third power control signals based upon the value of the power control signal. Wide range power control can thereby be provided to reduce the near-far problem and/or reduce power consumption.

It will be understood by those having skill in the art that radio frequency transmitters according to the present invention may be combined with a duplexer that is coupled between the power amplifier and the antenna, and a receive circuit that is coupled to the duplexer, to thereby provide a radio frequency transceiver. A mobile radiotelephone user interface may also be provided to provide a mobile radiotelephone.

Subcombinations of power control according to the present invention may also be used. Thus, for example, the radio frequency transmitter may not include a VSWR controller, or the VSWR controller may not be controlled by the power controller. The radio frequency power amplifier may be controlled by a first power control signal and the output of the radio frequency power amplifier may be attenuated by a second power control signal. Alternatively, a first power control signal can control the amplification of the radio frequency power amplifier and a second power control signal can activate a radio frequency switch that bypasses the radio frequency power amplifier. In another embodiment, the radio frequency power amplifier is controlled in response to a first power control signal and an attenuator is controlled in response to a second power control signal.

Power controlling methods for radio frequency transmitters according to the present invention control amplification of the radio frequency power amplifier and attenuation of the power control attenuator in response to a power control signal, to thereby provide power control of the radio frequency transmitter. Attenuation of the VSWR controller may also be controlled in response to the power control signal. In a preferred embodiment, minimum amplification of the radio frequency power amplifier is first provided. Then, if additional power control is desired, the power control attenuator is attenuated. In providing minimum amplification, the radio frequency power amplifier may be bypassed. In another embodiment, minimum amplification of the radio frequency power amplifier is first provided. Then, the VSWR controller and the power control attenuator are attenuated to provide the desired power control. Accordingly, power control systems and methods that are capable of wide range power control are provided, to thereby reduce near-far interference and/or reduce power consumption in mobile radiotelephones.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "coupled" indicates that a first element is connected to a second element either by a direct electrical connection, by an electromagnetic connection such as an optical connection or by one or more indirect electrical and/or electromagnetic connections, wherein other intervening elements are included.

Figure 2:
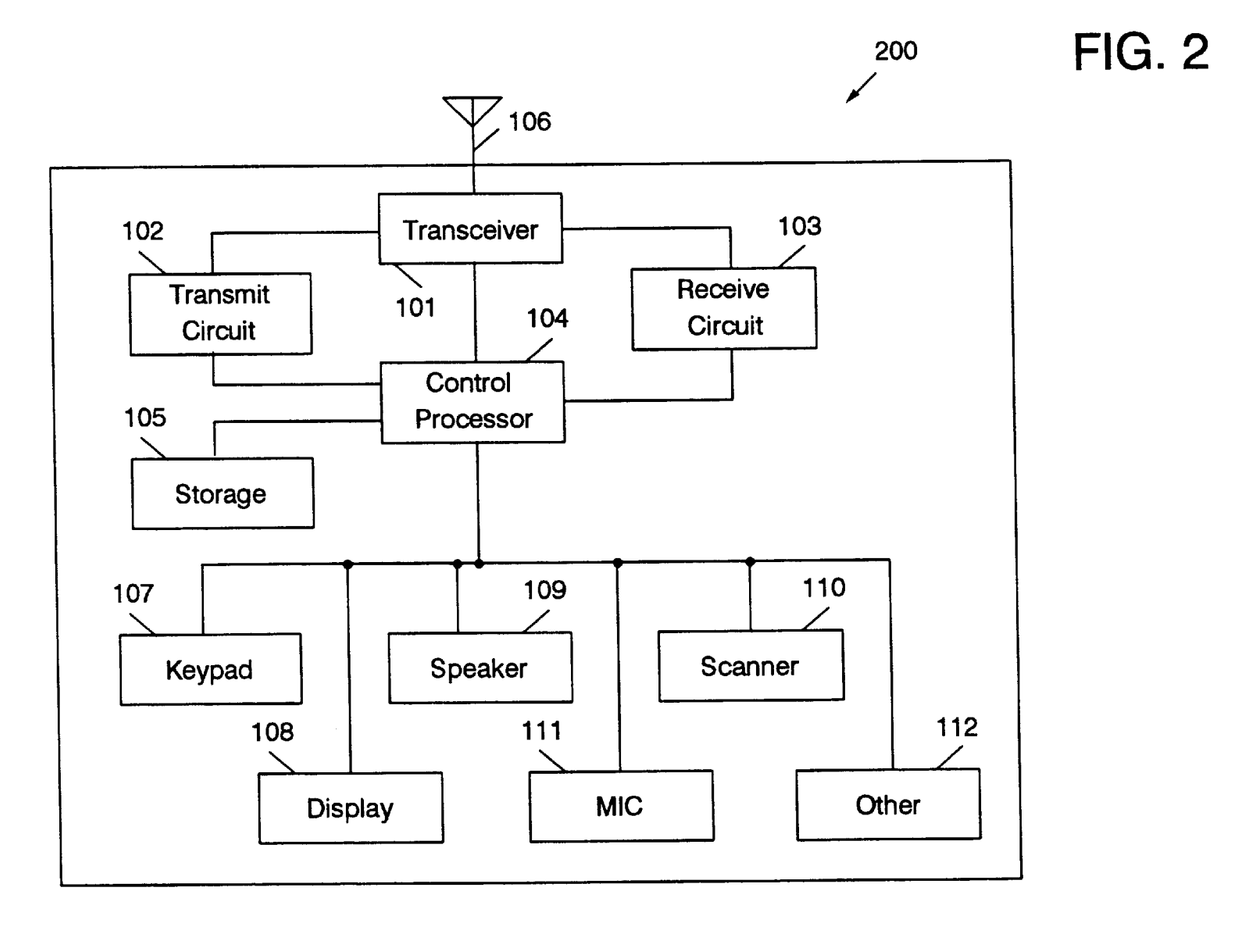
FIG. 2 is a block diagram of mobile radiotelephones according to the invention.

Referring now to FIG. 2, a simplified block diagram of mobile radiotelephones according to the present invention is shown. As shown in FIG. 2, mobile radiotelephone 200 can be a cellular telephone, a satellite telephone, or a high function terminal that provides functions in addition to those of a cellular telephone, such as facsimile, data communications, data processing, word processing, and other personal communications systems functions. These high function terminals are often referred to as Personal Communications Systems (PCS). Multiple mode wireless communication terminals that embody two or more of these functions are also included.

As shown in FIG. 2, mobile radiotelephone 200 includes a transceiver 101 that is coupled to antenna 106. As will be described in detail below, transceiver 101 includes a transmit chain that transmits a transmit signal to the antenna 106 and a receive chain that generates a receive signal from the antenna 106.

Still referring to FIG. 2, mobile radiotelephone 200 also includes a control processor 104 and storage (memory) 105 that is coupled to control processor 104 to provide a storage capacity for program and data information. As further shown in FIG. 2, mobile radiotelephone 200 also generally includes a user interface including a keypad 107, a display 108, a speaker 109 and a microphone 111. In order to provide a wireless communications terminal for receiving transmission of audio, video data and/or multimedia signals, keypad 107 may be a full scale personal computer keyboard, and display 108 may be a large graphics display. A scanner 110 may also be provided, as may other devices 112, such as disk drives and modems to provide a PCS terminal. Transmit circuit 102 and receive circuit 103 are also coupled to transceiver 101 and to control processor 104, to perform transmit and receive signal processing respectively.

The design of transceiver 101 according to the present invention will be described in detail below. It will be recognized that the other elements of mobile radiotelephone 200 are well known to those having skill in the art and need not be described further herein. Moreover, any and all of the elements of FIG. 2 may be embodied using one or more analog or digital integrated circuits, microprocessors that run a stored program, Application-Specific Integrated Circuits (ASIC), or any other combination of hardware and/or software.

Figure 3:
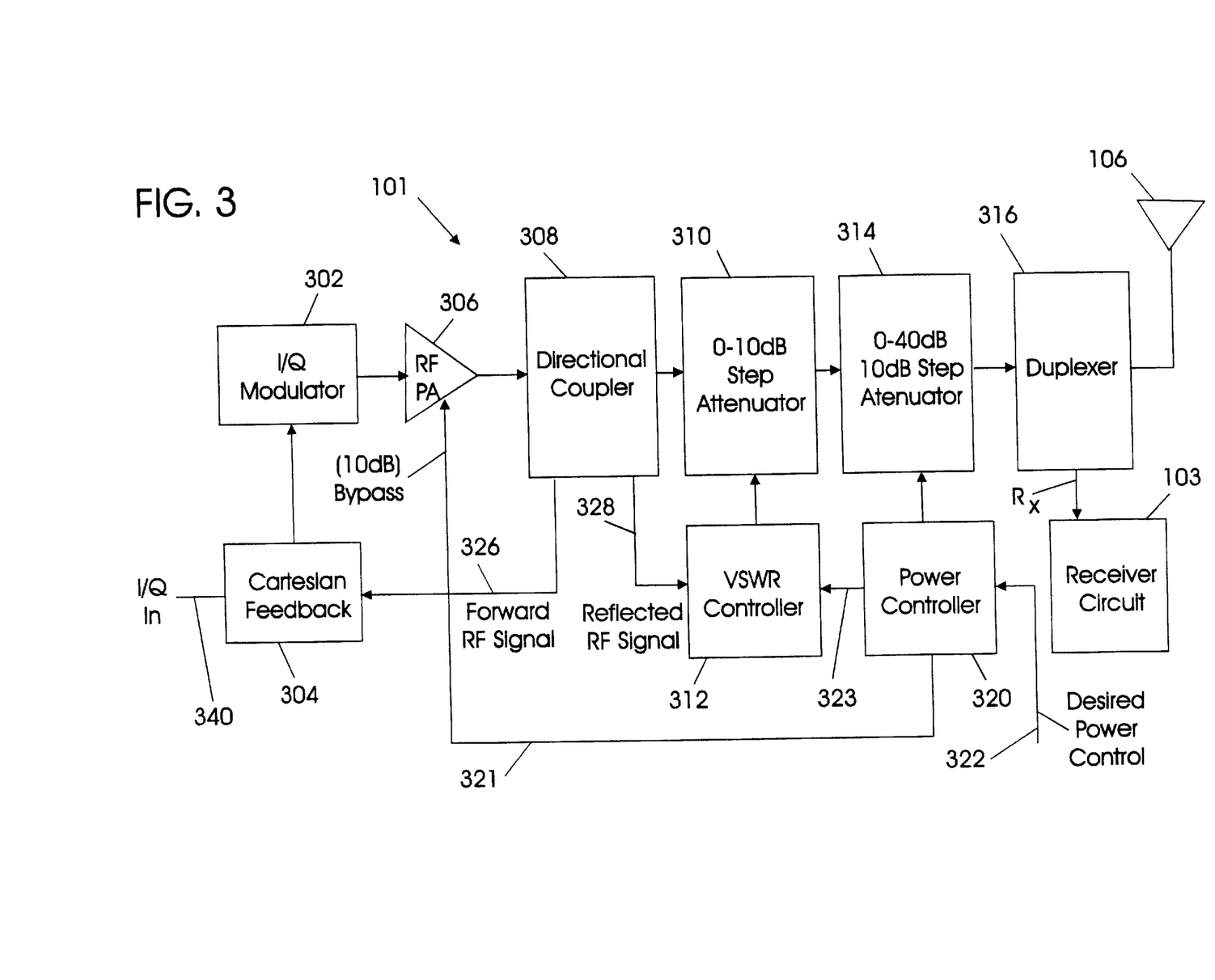
FIG. 3 is a block diagram illustrating a first embodiment of transceivers according to the present invention.

Referring now to FIG. 3, a transceiver 101 including radio frequency transmitters according to the present invention will now be described. As shown in FIG. 3, in-phase and quadrature input signals 340 are applied to a Cartesian feedback circuit 304, the output of which is applied to an in-phase and quadrature (I/Q) modulator 302 to modulate the input signals 340. It will be understood, however, that other types of modulators including but limited to FM or phase modulators may also be used, with or without Cartesian feedback. A radio frequency power amplifier 306 is coupled to the modulator 302 to amplify the modulated input signal. The output of the radio frequency power amplifier 306 is provided to a directional coupler 308. As is well known to those having skill in the art, a directional coupler is a radio frequency component that detects the RF power signal 326 from the power amplifier 306 and the reflected RF signal 328 that is reflected back from the antenna 106. The forward RF signal 326 is fed back to Cartesian feedback circuit 304 to close the feedback loop.

The reflected RF signal 328 is provided to a voltage standing wave ratio (VSWR) attenuator 310 via a VSWR controller 312. In response to the reflected RF signal 328, VSWR controller 312 attenuates the output of the power amplifier 306 using a VSWR attenuator 310 which, for example, may provide between 0 and −10 dB attenuation in 1 dB steps. Accordingly, the VSWR attenuator attenuates the output of the radio frequency power amplifier 306 in response to reflected power from the antenna. Thus, wide VSWR swings can be compensated by dynamically altering the impedance of the output of the power amplifier as the detected VSWR increases or decreases. Attenuation of the output of a radio frequency power amplifier using a VSWR controller 312 and VSWR attenuator 310 is described in U.S. application Ser. No. 08/839,810, filed Apr. 18, 1997, entitled "VSWR Control Technique for Terminal Products With Linear Modulation" to the present inventor, assigned to the assignee of the present application, the disclosure of which is hereby incorporated herein by reference.

Continuing with the description of FIG. 3, a duplexer 316 couples the transmit circuit and a receive circuit 103 to antenna 106. As is well known to those having skill in the art, a duplexer is a radio frequency device that isolates a receiver from a transmitter, while allowing them to share a common antenna. The design of transceiver 101, and more specifically of components 302, 304, 306, 308, 316, 103 and 106 as described above is well known to those having skill in the art and need not be described further herein. Moreover, the design of VSWR controller 312 and VSWR attenuator 310 is described in the above-mentioned copending application, and need not be described further herein.

According to the invention, wide range power control may be obtained by using power controller 320. Power controller 320 is responsive to a desired power control signal 322. The desired power control signal 322 may be generated by the control processor of FIG. 1 using conventional power control techniques. However, in contrast with conventional power control techniques, power control greater than 10 dB, and more specifically power control of up to 60 dB or more may be provided.

Power controller 320 produces a first power control signal 321 that controls radio frequency power amplifier 306 to provide a predetermined amount of amplification. As will be described below, the amplification of RF power amplifier 306 may be reduced by up to 10 dB or more, and the RF power amplifier 306 may also be bypassed. Power controller 320 also generates a second power control signal 322 that is applied to a power control (second) step attenuator 314. Power control attenuator 314 may provide 0 to 40 dB of attenuation in 10 dB steps. Finally and optionally, power controller 320 may generate a third power control signal 323 that is applied to VSWR controller 312. Since VSWR attenuator 310 is capable of 10 dB of attenuation, and the VSWR controller 312 may attenuate the VSWR attenuator 310 by less than 10 dB in response to the reflected power, power controller 320 can cause VSWR controller 312 to further attenuate the output of RF power amplifier 306 in response to a third power control signal 323. By generating first, second and third power control signals 321, 322 and 323 to control the power amplifier 306, power control attenuator 314 and VSWR attenuator 310 by varying amounts, a wide range of power control may be obtained.

Figure 4:
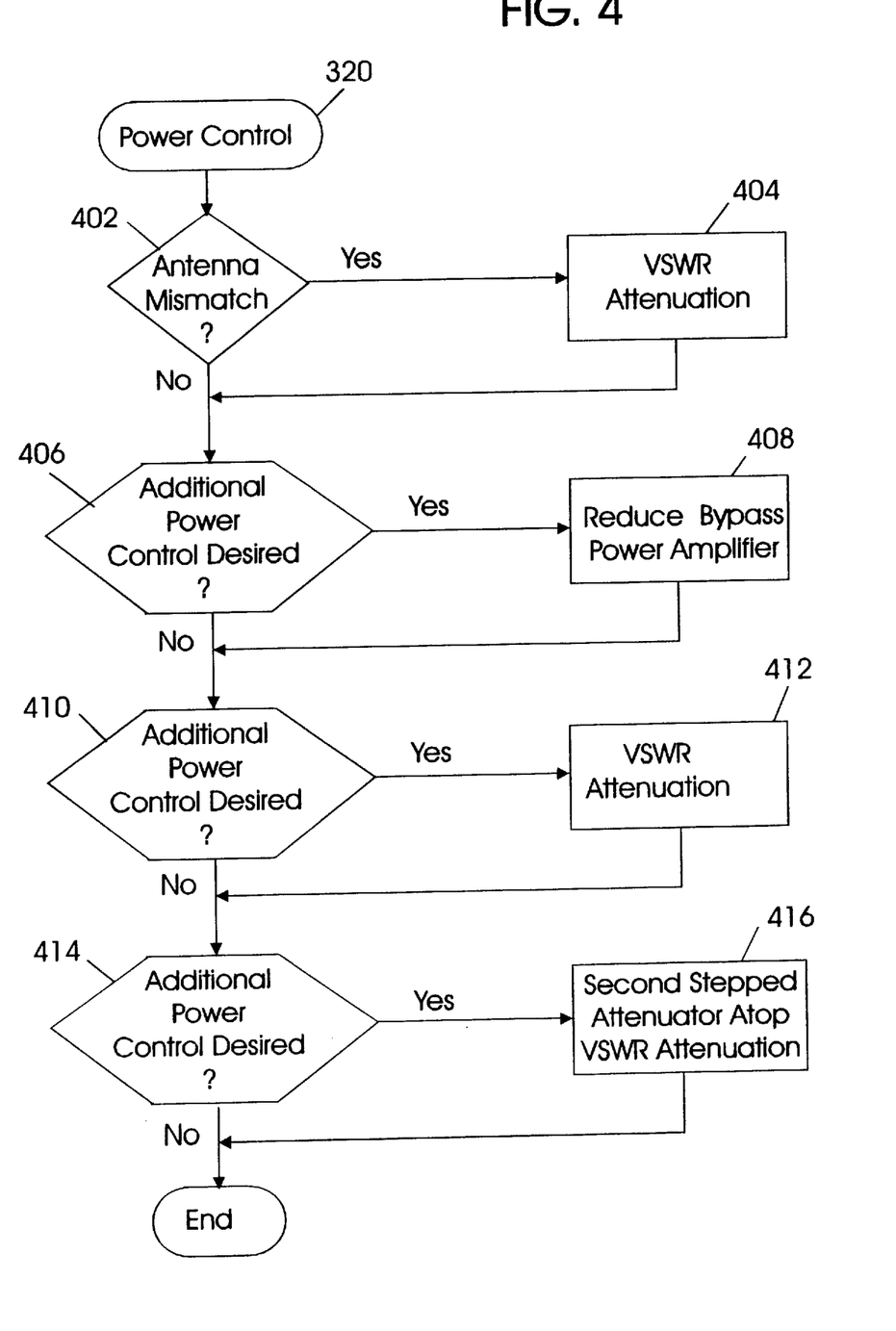
FIG. 4 is a flowchart illustrating operations performed by power controllers of FIG. 3.

FIG. 4 is a flowchart that illustrates operations for power control according to the present invention. These operations may be performed by power controller 320. However, it will be understood by those having skill in the art that power controller 320 need not be a separate component, but may be included in control processor 104 of FIG. 2.

As will also be appreciated by one of skill in the art, the present invention may be embodied as methods, systems (apparatus), or computer program products. Accordingly, the present invention may take the form of an entirely hardware embodiment, an entirely software embodiment or an embodiment combining software and hardware aspects. Furthermore, the present invention may take the form of a computer program product on a computer-readable storage medium having computer-readable program code means embodied in the medium. Any suitable computer readable medium may be utilized including hard disks, CD-ROMs, optical storage devices, or magnetic storage devices.

Figure 6:
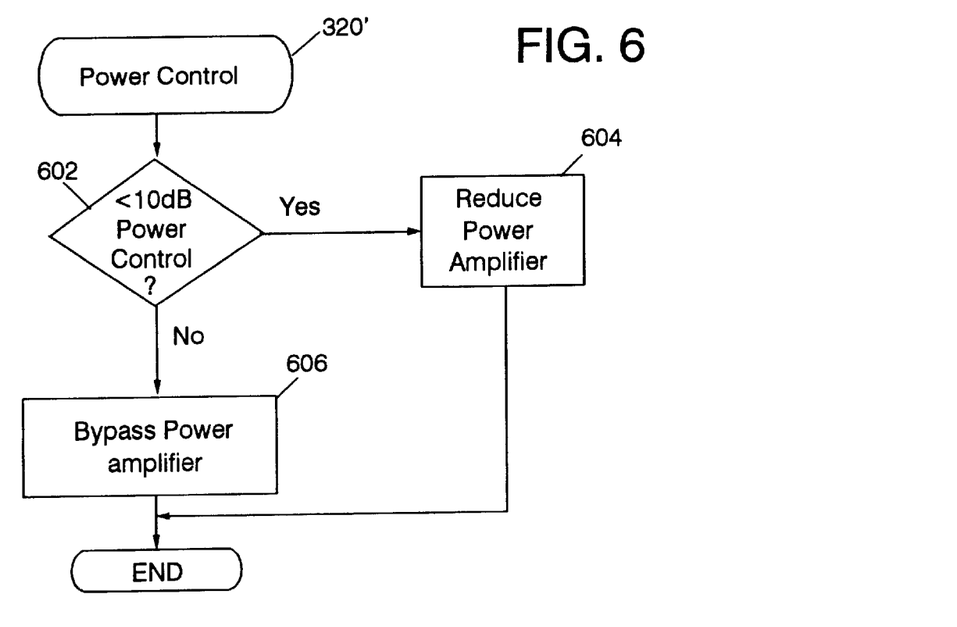
FIG. 6 is a flowchart illustrating operations performed by power controllers of FIG. 5.
Figure 8:
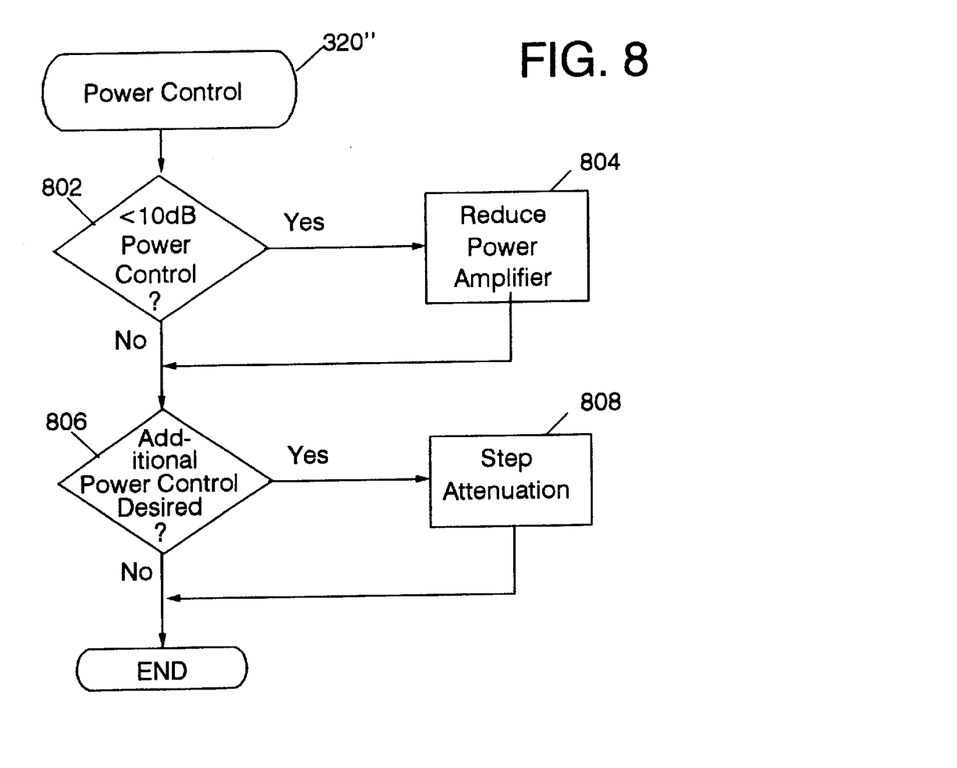
FIG. 8 is a flowchart illustrating operations performed by power controllers of FIG. 7.

Operations for various aspects of the present invention are illustrated in detail in FIGS. 4, 6 and 8 which are flowchart illustrations. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory that can direct a processor or other programmable data processing apparatus to function in a particular manner, such that the instructions stored in the computer-readable memory produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

In general, power control is preferably provided by first adjusting VSWR attenuator 310 to compensate for antenna mismatch. Then, if additional power control is desired, the amplification of RF power amplifier is reduced or even bypassed, to thereby reduce power dissipation therein. More specifically, as shown in FIG. 4, if an antenna mismatch is present at Block 402, then VSWR attenuation is provided at Block 404 via VSWR attenuator 310. VSWR attenuation may be up to 10 dB, and may be provided using techniques described in the above-cited copending application. VSWR attenuation at Block 404 preferably occurs independent of any power control input, but rather takes place in response to the reflected RF signal 328 of FIG. 3.

Continuing with the description of FIG. 4, if additional power control is desired at Block 406 as indicated by the desired power control signal 322 of FIG. 3, the amplification of the RF power amplifier 306 is reduced by a predetermined amount in response to the first power control signal 321. Accordingly, for example if between 0 and 10 dB of additional attenuation is desired, as indicated by the desired power control signal 322, power controller 320 generates first power control signal 321 that reduces the amplification of RF power amplifier by a desired amount up to 10 dB. This attenuation may be obtained, for example by bypassing an internal stage of the power amplifier. As will be described below, if large amounts of attenuation are desired, the power amplifier can be totally bypassed, for example by providing an RF switch around the amplifier. Thus, an additional attenuation of 30 dB may be provided in addition to the 0 to 10 dB range of power control.

Referring again to FIG. 4, if additional amounts of power control are still at desired at Block 410, then the VSWR attenuator 310 is controlled by applying second power control signal 323 to VSWR controller 312, to thereby provide additional attenuation up to 10 dB via the first step attenuator. If still additional power control is desired at Block 414, then the VSWR and power control attenuators 310 and 314 are controlled in combination to obtain the desired amount of power control. The power control attenuator 314 may be used in 10 dB steps using second power control signal 322 and the VSWR step attenuator 310 may be controlled in steps of 1 dB using third power control signal 323 to obtain the total desired amount of step attenuation. Thus, the power control attenuator 314 can operate as a coarse attenuator and the VSWR attenuator 310 can operate as a fine attenuator.

In a specific example, for all power levels from 100 milliwatt to 1 watt, power control is performed by the power amplifier control using the first power control signal, with the VSWR attenuator 310 controlled only by the VSWR controller 312. For power control below the 100 milliwatt level, the VSWR controller 312 rises to its minimum level, up to the 10 dB value, and the VSWR controller 312 uses this minimum value with a perfectly matched antenna. Once the minimum reaches 10 dB, then a 10 dB step in the power control attenuator is added, and the VSWR attenuator 310 becomes a fine resolution attenuator for power control. If the power control attenuator is to be used at a lower power level, then the steps can be made finer and the VSWR attenuator may be left at maximum attenuation while using the second step attenuator 314. Otherwise, the two attenuators 310 and 314 can be used together to provide an accurate power control range of 60 dB or greater. In any case, the VSWR control block can be disabled beyond a certain minimum attenuation level. Accordingly, VSWR control may be used for low attenuation levels and fine control may be provided at high attenuation levels.

Figure 5:
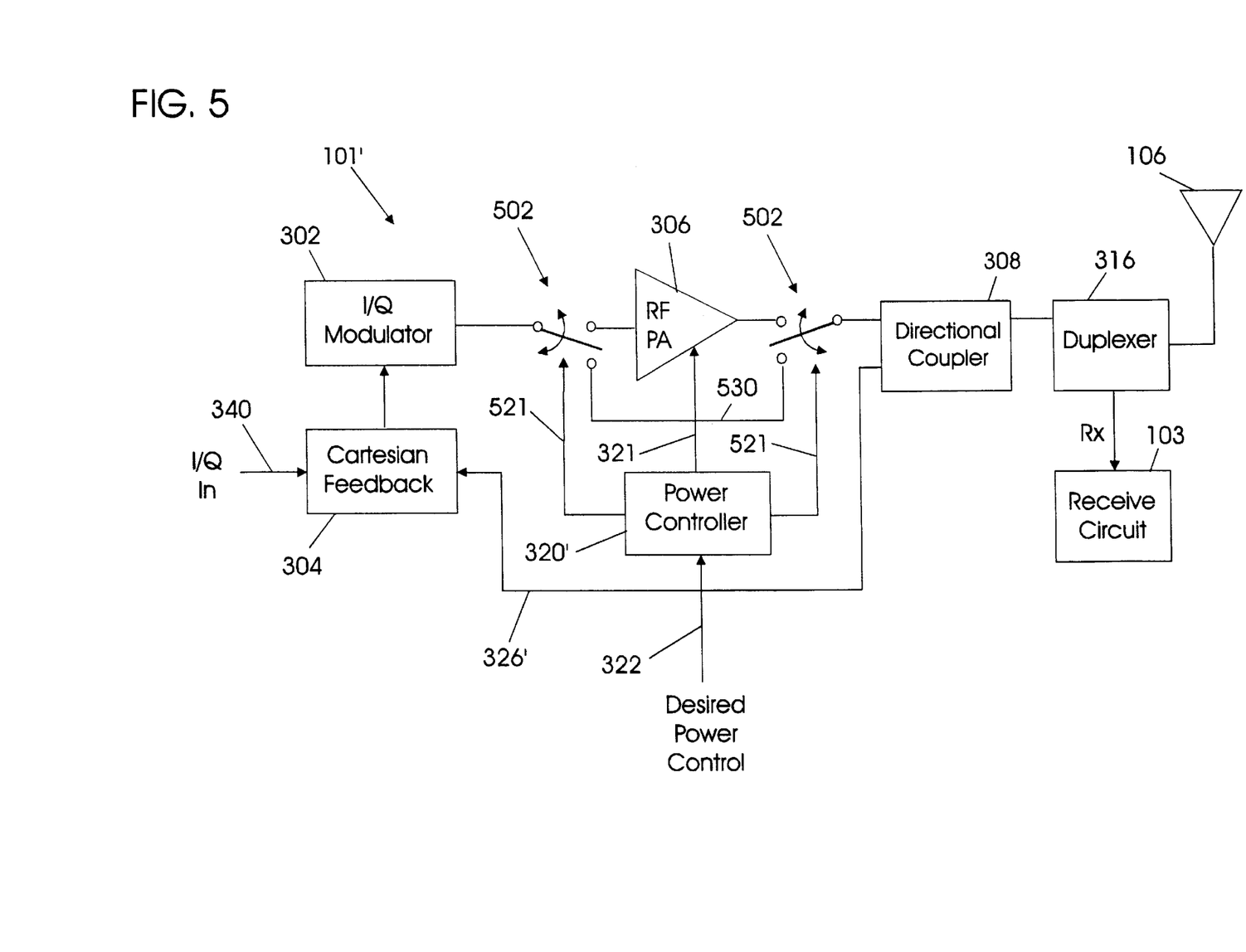
FIG. 5 is a block diagram illustrating a second embodiment of transceivers according to the present invention.

FIG. 5 is a block diagram of a second embodiment of power control according to the invention. This power control does not use VSWR control or a power control attenuator, as was the case in FIG. 3. However, an additional 30 dB of attenuation may be provided by bypassing the power amplifier entirely. More specifically, as shown in FIG. 5, transceiver 101' includes an I/Q modulator 302, RF power amplifier 306, directional coupler 308, duplexer 316, antenna 106 and receive circuit 103, as was already described in connection with FIG. 3. Cartesian feedback circuit 304 operates on I/Q input signal 340 by obtaining a Cartesian feedback signal 326' from duplexer 316.

As shown in FIG. 6, power controller 320' is responsive to a desired power control signal 322, to generate a first power control signal 321 that can reduce the amplification of RF power amplifier 306, for example by up to 10 dB. An RF switch 502 is also provided. RF switch 502 operates in response to bypass power control signal 521 to bypass RF power amplifier 306 using bypass path 530.

Accordingly, up to 10 dB of reduced amplification may be provided by first power control signal 321, to thereby attenuate the output of power amplifier 306 from full output at 1 watt to −10 dB output of 100 milliwatts in 1 dB steps. Moreover, the one milliwatt input signal to the power amplifier may be bypassed around power amplifier 306 using bypass path 530 in response to bypass power control signal 521.

FIG. 6 illustrates power control operations 320' for the embodiment of FIG. 5. As shown, if less than 10 dB of power control is desired at Block 602, then the power amplifier amplification is reduced at Block 604 using first power control signal 321. If more than 10 dB power control is desired, then the power amplifier is bypassed at Block 606 using bypass power control signal 521, RF switch 502 and bypass path 530. Accordingly, 30 dB of attenuation may be provided in addition to the 0 to 10 dB range of a conventional power control. This power control may therefore obtain a 20 dB improvement in the near-far problem. Moreover, when bypassing the power amplifier, the power amplifier can be turned off so that power is conserved.

It will also be understood that rather than bypassing the entire power amplifier, stages of the power amplifier may also be bypassed to provide more than 10 dB attenuation using the first power control signal 321. Thus, for example, in order to provide additional bypass, the final stage of the RF power amplifier may be turned off. It will also be understood that the system of FIG. 5 may be combined with VSWR control as was described in connection with FIG. 3.

Figure 7:
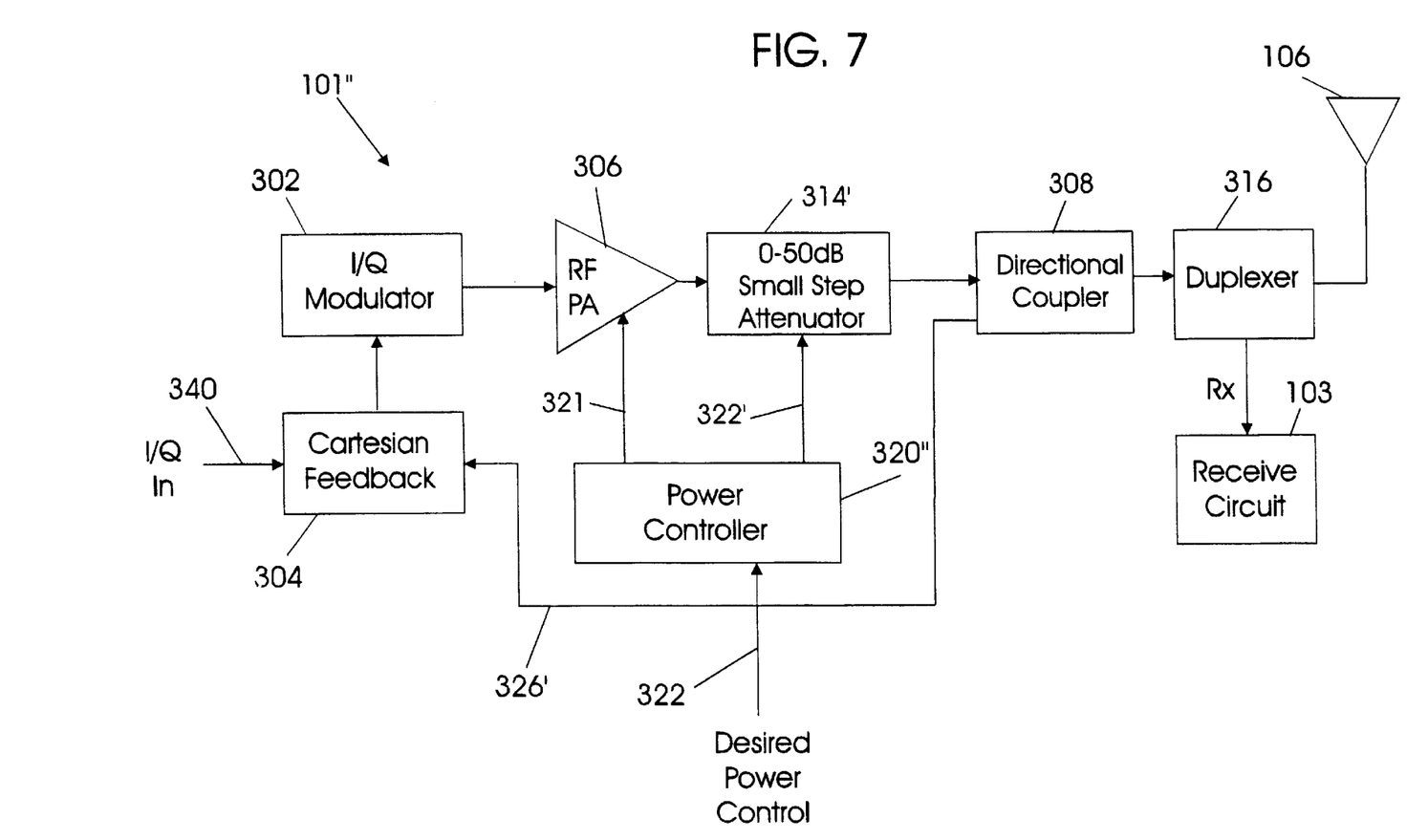
FIG. 7 is a block diagram illustrating a third embodiment of transceivers according to the present invention.

Referring now to FIG. 7, the third embodiment of power control according to the present invention will now be described. As shown in FIG. 7, transceiver 101" uses I/Q modulator 302, RF power amplifier 306, directional coupler 308, duplexer 316, antenna 106, receive circuit 103, Cartesian feedback 304, feedback signal 326' and I/Q input signal 340, as was already described. In FIG. 4, power controller 320" is responsive to desired power control signal to reduce amplification of RF power amplifier 306 via first power control signal 321, and to attenuate the output of RF power amplifier 306 using a power control attenuator 314' in response to second power control signal 322'. In FIG. 7, power control attenuator 314' may be a 0 to 50 dB, 1 dB step attenuator.

As shown in FIG. 8, power control 320' according to this embodiment determines whether power control is desired at Block 802. If so, the amplification of power amplifier is reduced at Block 804 up to a maximum reduction. If additional power control is desired at Block 806, then step attenuation is provided at Block 808. Accordingly, for example, 0 to 10 dB of attenuation may be provided by using the 0 to 10 dB range of the power amplifier with attenuator 314' switched out. Then, once the power amplifier has reached its minimum power level, attenuation is added by the attenuator 314'. Accordingly, 10 dB of power control may be applied to power amplifier 306, to reduce a 1 watt output to 100 milliwatts. The attenuator 314' may then operate only on power amplifier outputs of 100 milliwatts to attenuate this output even further. Thus, the attenuator 314' need only handle a maximum of a 100 milliwatts of power. If this power is too large, then the power control range of the power amplifier can be increased beyond 10 dB to ease the dissipation constraints on the attenuator.

Accordingly, wide range power control systems and methods are provided that can reduce or eliminate near-far problems. Power consumption may also be reduced. Power controlling systems and methods according to the invention need not add large current drain to portable radiotelephones and need not add complicated circuitry.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A radio frequency transmitter comprising:

a modulator that modulates an input signal;

a radio frequency power amplifier that is coupled to the modulator to amplify the modulated input signal by a predetermined amount in response to a first power control signal;

an antenna;

a voltage standing wave ratio (VSWR) attenuator that is coupled between the radio frequency power amplifier and the antenna to attenuate the output of the radio frequency power amplifier in response to reflected power from the antenna; and a power control attenuator that is coupled between the radio frequency power amplifier and the antenna to attenuate the output of the radio frequency power amplifier in response to a second power control signal.

2. A radio frequency transmitter according to claim 1 further comprising:

a power controller that generates the first power control signal and the second power control signal to thereby provide power control for the radio frequency transmitter.

3. A radio frequency transmitter according to claim 2 wherein the power controller also generates a third power control signal, and wherein the VSWR attenuator is also responsive to the third power control signal.

4. A radio frequency transmitter according to claim 1 in combination with:

a duplexer that is coupled between the power amplifier and the antenna; and a receive circuit that is coupled to the duplexer to thereby provide a radio frequency transceiver.

5. A radio frequency transmitter according to claim 4 in further combination with a mobile radiotelephone user interface.

6. A radio frequency transceiver according to claim 2 wherein the power controller provides minimum amplification of the radio frequency power amplifier via the first signal before attenuating the power control attenuator via the second signal.

7. A radio frequency transceiver according to claim 6 wherein the power controller bypasses the radio frequency power amplifier before attenuating the power control attenuator via the second signal.

8. A radio frequency transceiver according to claim 3 wherein the power controller provides minimum amplification of the radio frequency power amplifier via the first signal before attenuating the output of the radio frequency power amplifier via the second signal and the third signal.

9. A radio frequency transceiver according to claim 3 wherein the power controller provides maximum attenuation of the output of the radio frequency power amplifier via the third signal before controlling the radio frequency power amplifier via the first and second signals.

10. A radio frequency transceiver according to claim 1 wherein the VSWR attenuator and the power control attenuator are serially coupled between the power amplifier and the antenna.

11. A radio frequency transmitter comprising:

means for modulating an input signal;

means for amplifying the modulated input signal by a predetermined amount in response to a first power control signal to produce an amplified radio frequency output;

an antenna that is coupled to the amplified radio frequency output;

first means for attenuating the amplified radio frequency output in response to reflected power from the antenna; and second means for attenuating the amplified radio frequency output in response to a second power control signal.

12. A radio frequency transmitter according to claim 11 further comprising:

means for generating the first power control signal and the second power control signal.

13. A radio frequency transmitter according to claim 12 wherein the generating means further comprises means for generating a third power control signal, and wherein the first means for attenuating is also responsive to the third power control signal.

14. A radio frequency transmitter according to claim 11 in combination with:

means for receiving radio frequency signals; and means for switching the antenna between the amplified radio frequency output and the receiving means to thereby provide a radio frequency transceiver.

15. A radio frequency transmitter according to claim 14 in further combination with means for interfacing a mobile radiotelephone user to the radio frequency transmitter and to the means for receiving.

16. A radio frequency transmitter comprising:

a modulator that modulates an input signal;

a radio frequency power amplifier that is coupled to the modulator to amplify the modulated input signal by a predetermined amount in response to a first power control signal;

an antenna; and an attenuator that is coupled between the radio frequency power amplifier and the antenna to attenuate the output of the radio frequency power amplifier in response to a second power control signal.

17. A radio frequency transmitter according to claim 16 further comprising:

a power controller that generates the first power control signal and the second power control signal to thereby provide power control for the radio frequency transmitter.

18. A radio frequency transmitter according to claim 16 in combination with:

a duplexer that is coupled between the power amplifier and the antenna; and a receive circuit that is coupled to the duplexer to thereby provide a radio frequency transceiver.

19. A radio frequency transmitter according to claim 18 in further combination with a mobile radiotelephone user interface.

20. A radio frequency transceiver according to claim 17 wherein the power controller provides minimum amplification of the radio frequency power amplifier via the first signal before attenuating the attenuator via the second signal.

21. A power controlling method for a radio frequency transmitter that includes a modulator that modulates an input signal, a radio frequency power amplifier that is coupled to the modulator to amplify the modulated input signal, an antenna, a voltage standing wave ratio (VSWR) attenuator that is coupled between the radio frequency power amplifier and the antenna to attenuate the output of the radio frequency power amplifier in response to reflected power from the antenna, and a power control attenuator that is coupled between the radio frequency power amplifier and the antenna, the power controlling method comprising the step of:

controlling amplification of the radio frequency power amplifier and attenuation of the power control attenuator in response to a power control signal, to thereby provide power control of the radio frequency transmitter.

22. A method according to claim 21 wherein the controlling step further comprises the step of:

controlling amplification of the radio frequency power amplifier, attenuation of the power control attenuator and attenuation of the VSWR attenuator in response to a power control signal, to thereby provide power control of the radio frequency transmitter.

23. A method according to claim 21 wherein the controlling step comprises the steps of:

providing minimum amplification of the radio frequency power amplifier; and then attenuating the power control attenuator.

24. A method according to claim 23 wherein step of providing minimum amplification comprises the step of:

bypassing the radio frequency power amplifier.

25. A method according to claim 22 wherein the controlling step comprises the steps of:

providing minimum amplification of the radio frequency power amplifier; and then attenuating the power control attenuator and the VSWR attenuator.

26. A power controlling method for a radio frequency transmitter that includes a modulator that modulates an input signal, a radio frequency power amplifier that is coupled to the modulator to amplify the modulated input signal, and an antenna that is coupled to the radio frequency power amplifier, the power controlling method comprising the steps of:

attenuating the output of the radio frequency power amplifier in response to reflected power from the antenna; and controlling amplification of the radio frequency power amplifier and further attenuating the output of the radio frequency power amplifier in response to a power control signal, to thereby provide power control of the radio frequency transmitter.

27. A method according to claim 26 wherein the controlling step comprises the steps of:

providing minimum amplification of the radio frequency power amplifier; and then further attenuating the output of the radio frequency power amplifier in response to the power control signal.

28. A method according to claim 27 wherein the step of providing minimum amplification comprises the step of:

bypassing the radio frequency power amplifier.

* * * * *